United States Patent [19]

Sheppard

[11] 4,385,369
[45] May 24, 1983

[54] SEMICONDUCTOR MEMORY ADDRESS BUFFER HAVING POWER DOWN MODE

[75] Inventor: Douglas P. Sheppard, Grapevine, Tex.

[73] Assignee: Mostek Corporation, Carrollton, Tex.

[21] Appl. No.: 294,841

[22] Filed: Aug. 21, 1981

[51] Int. Cl.³ .............................................. G11C 8/00
[52] U.S. Cl. .................................... 365/227; 365/230
[58] Field of Search .................. 307/296 A; 365/227, 365/230, 231

[56] References Cited

U.S. PATENT DOCUMENTS 4,159,540  6/1979  Smith et al. ........................ 365/230
4,185,321  1/1980  Iwahashi et al. .................... 365/227

FOREIGN PATENT DOCUMENTS 31672      8/1981  European Pat. Off. ............ 365/227
2060303A   4/1981  United Kingdom ................ 365/227

Primary Examiner—George G. Stellar

[57] ABSTRACT

A semiconductor memory address buffer (10) includes a plurality of serially connected inverter amplifier stages (76, 78, 80, and 82). An output stage (84) is connected to the last two inverter amplifier stages (80, 82). In the active mode of operation circuit (10) functions as a driver which receives an input address signal (A) and produces complementary output address signals (A, $\bar{A}$). In a power down mode a group of transistors (18, 20 and 22) are turned off to deactive corresponding stages (76, 78 and 82) to terminate power consumption by these stages. A transistor (36) is activated to drive the input node (38) of a selected stage (80) to turn off a transistor (48) and essentially terminate power consumption by the selected stage (80). The output stage (84) receives differential inputs and functions in a push-pull configuration to produce the complementary output address signals (A, $\bar{A}$). In the power down mode the buffer (10) has essentially zero power consumption while producing predetermined state complementary output signals (A, $\bar{A}$).

7 Claims, 1 Drawing Figure

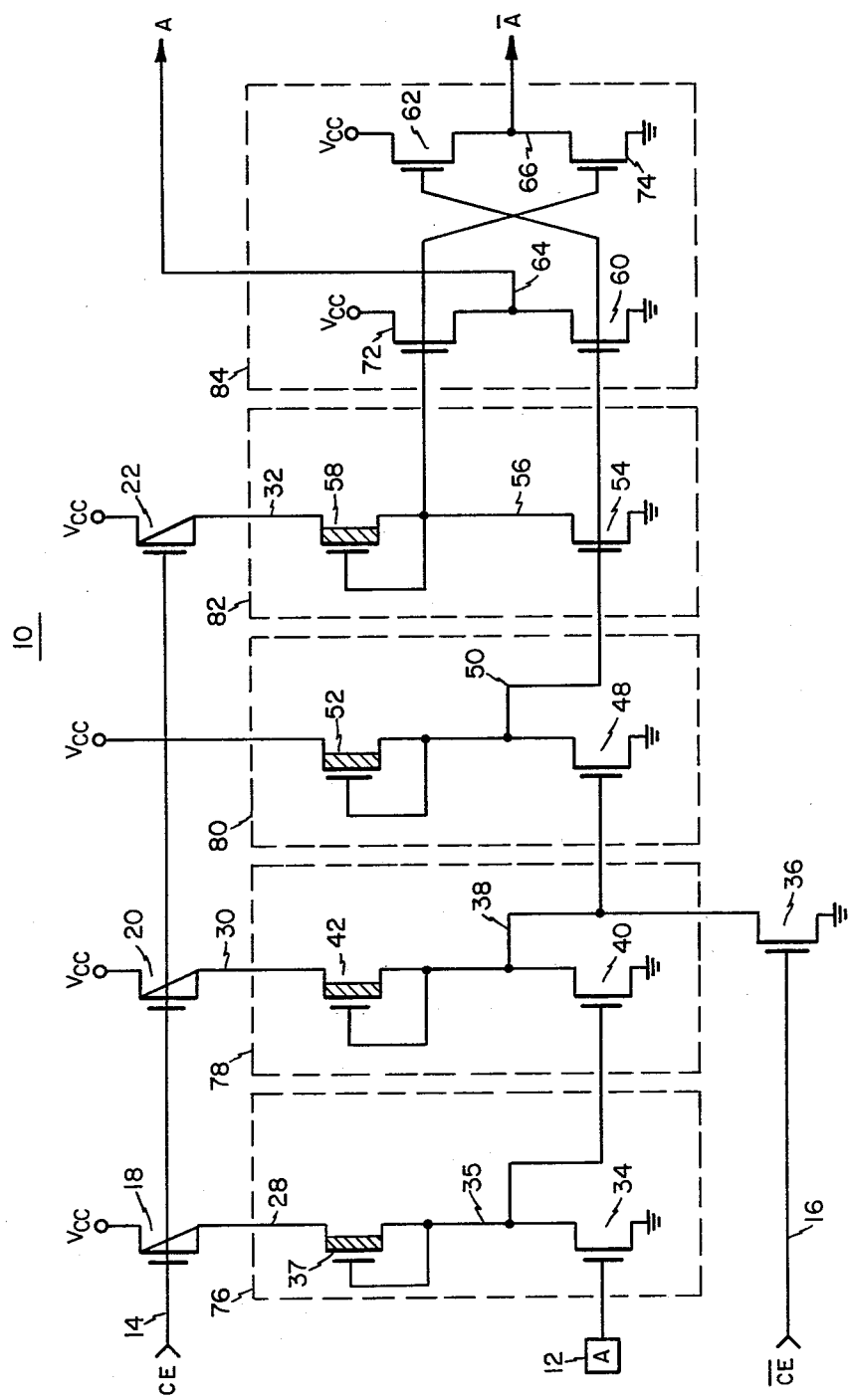

SEMICONDUCTOR MEMORY ADDRESS BUFFER HAVING POWER DOWN MODE

TECHNICAL FIELD

The present invention pertains to semiconductor memories and in particular to an address buffer for such memories.

BACKGROUND ART

Among the primary objectives in the design of semiconductor memories are the reduction in the area of silicon required for the circuit and minimization of the power consumed by the circuit. One method for reducing power consumption is to "power down" portions of the memory when the overall circuit is not actively being used. Such a power down state can be initiated by a chip enable (CE) signal which is supplied in most applications for semiconductor memories.

It has further been a general design objective for semiconductor memories to pull all of the address lines to a ground state when the circuit is in a power down mode. This has been the traditional approach to assure that stored data will not be altered during the power down mode.

As a result of designing memory circuits to reduce power and to pull down all address lines there has been an increase in the number and size of transistors required to operate the circuit. This, however, increases the manufacturing costs for the circuit and can limit its operating speed. Address buffers have been a particular problem in this regard. As greater numbers of transistors are added to disable the address buffer a greater load is created for the chip enable buffer. This increase in load requires that even larger transistors be used for the chip enable buffer. Large memory circuits have a substantial number of address buffers and this multiplies the problem of increasing numbers and sizes of transistors.

In view of the problems of transistor numbers, sizes and power consumption involved in the provision of a power down mode for a semiconductor memory, there exists a need for an address buffer which can be operated in a power down mode with an absolute minimum of additional circuitry required for this function.

SUMMARY OF THE INVENTION

A selected embodiment of the present invention comprises a semiconductor memory address buffer which can operate in a power down mode. The address buffer includes a plurality of serially connected amplifier stages, the first of the amplifier stages connected to receive an input address signal. Circuitry is provided to receive an enable signal, which has a power down state, to terminate power consumption for all but a first selected one of the amplifier stages when the enable signal is in the power down state. Further circuitry is provided which is connected to receive the enable signal and serves to drive the input of the first selected amplifier stage to a state wherein the first selected amplifier stage has essentially zero power consumption. The first selected amplifier stage in turn drives a second selected amplifier stage to a predetermined state. An output stage of the buffer is connected to the first and second selected amplifier stages and serves to generate complementary output address signals that are a function of the input address signal when the enable signal is an other than the power down state. The output stage further serves to generate predetermined complementary output address signals when the enable signal is in other than the power down state. Thus, in the power down state the address buffer has essentially zero power consumption but provides a true and complement output address signal.

BRIEF DESCRIPTION OF THE DRAWING

For a more complete understanding of the present invention and the advantages thereof, reference is now made to the following Description taken in conjunction with the accompanying Drawing in which the FIGURE is a schematic illustration of an address buffer having a power down mode in accordance with the present invention.

DETAILED DESCRIPTION

An address buffer 10 in accordance with the present invention is illustrated in the FIGURE. The address buffer 10 serves to receive one bit of a memory address and to generate the true and complement of this one bit address signal with sufficient driving power to operate decoder circuits in the memory. The address buffer 10 further receives a chip enable (CE) signal which is utilized to drive the buffer 10 to a power down state when it is not being actively used. The power down feature reduces the power consumption of the overall circuit which includes the buffer 10.

An input address signal (A) bit is provided to a terminal 12. The CE signal is input to a node 14 while its complement $\overline{CE}$ is provided to a node 16. The buffer 10 receives a power supply voltage which is termed $V_{cc}$ and for the illustrated embodiment is +5 volts. Common terminals for buffer 10 are shown as ground which is also referred to as $V_{ss}$ in the field of integrated circuits.

Node 14, which receives the CE signal, is connected to the gate terminals of transistors 18, 20 and 22. The drain terminals for each of the transistors 18, 20 and 22 are connected to $V_{cc}$. The source terminal of transistor 18 is connected to a node 28. The source terminal of transistor 20 is connected to a node 30 and the source terminal of transistor 22 is connected to a node 32. The transistors 18, 20 and 22 are lightly depleted devices having a threshold of, for example, −0.5 volts.

The terminal 12, which receives the input address signal, is connected to the gate terminal of a transistor 34 which has the drain terminal thereof connected to a node 35 and the source terminal thereof grounded. A depletion transistor 37 has the gate and source terminals thereof connected to node 35 and the drain terminal thereof connected to node 28.

Node 16, which receives the $\overline{CE}$ signal, is connected to the gate terminal of a transistor 36 which has the drain terminal thereof connected to a node 38 and the source terminal thereof connected to ground.

A transistor 40 has the gate terminal thereof connected to node 28, the drain terminal thereof connected to node 38 and the source terminal thereof connected to ground.

A depletion transistor 42 has the gate and source terminals thereof connected to node 38 and the drain terminal thereof connected to node 30.

Node 38 is connected to the gate terminal of a transistor 48 which has the drain terminal thereof connected to a node 50 and the source terminal thereof connected to ground. A depletion transistor 52 has the gate and source terminals thereof connected to node 50 and the drain terminal thereof connected to $V_{cc}$.

The node 50 is connected to the gate terminal of a transistor 54 which has the drain terminal thereof connected to a node 56 and the source terminal thereof connected to ground. A depletion transistor 58 has the gate and source terminals thereof connected to node 56 and the drain terminal thereof connected to node 32.

The node 50 is further connected to the gate terminals of transistors 60 and 62. The drain terminal of transistor 60 is connected to a node 64 at which point is produced an output address signal A. The output address signal A corresponds to the true state of the input address signal at terminal 12. The source terminal of transistor 60 is connected to ground. The drain terminal of transistor 62 is connected to $V_{cc}$ and the source terminal of transistor 62 is connected to a node 66. The complement output address signal $\overline{A}$ is produced at node 66.

The node 56 is further connected to the gate terminals of transistors 72 and 74. The drain terminal of transistor 72 is connected to $V_{cc}$ while the source terminal thereof is connected to node 64. The drain terminal of transistor 74 is connected to node 66 and the source terminal thereof is connected to ground.

The buffer 10 comprises a plurality of serially connected stages. A stage 76 includes transistors 34 and 37. A stage 78 includes transistors 40 and 42. A stage 80 includes transistors 48 and 52. A stage 82 includes transistors 54 and 58. And, a final output stage 84 includes transistors 60, 62, 72 and 74. Each of the stages 76, 78, 80 and 82 comprises an inverter amplifier. The output stage 84 receives complementary inputs and produces corresponding complementary output signals.

Operation of the buffer 10 is now described in reference to the FIGURE. Buffer 10 has two modes of operation, active and power down. In the active mode buffer 10 functions as a driver which receives the input address signal at terminal 12 and produces the true and complement of the input address bit at nodes 64 and 66. The input at terminal 12 is generally at TTL levels and the circuit 10 provides sufficient driving power to operate large decoder circuits in the memory. The input address signal is provided to the stage 76 of the serially connected inverter stages 76, 78, 80 and 82. The output stage 84 receives differential inputs and functions as a push-pull circuit to produce the A and $\overline{A}$ output signals.

In the active mode the CE signal is at a high state and the transistors 18, 20 and 22 are conductive while the $\overline{CE}$ signal at a low state causes the transistor 36 to be nonconductive. The input address signal at terminal 12 serves to turn on or off transistor 34 and produce the opposite logic state at node 35. The logic state at node 35 serves to turn on or off transistor 40 and produce the opposite logic state therefrom at node 38. The logic state at node 38 serves to turn on or off transistor 48 and produce the opposite logic state at node 50. Likewise the logic state at node 50 serves to turn on or off the transistor 54 and produce the opposite logic state at node 56. The complementary logic states on nodes 50 and 56 serve to turn on and off the pairs of transistors 60, 62 and 72, 74. This produces a push-pull output at nodes 64 and 66.

In the power down mode the CE signal goes to a low state and the $\overline{CE}$ signal goes to a high state. This causes transistors 18, 20 and 22 to be turned off and causes transistor 36 to be turned on. The transistors 18, 20 and 22 open the power circuits for the corresponding inverters 76, 78 and 82 thus terminating power consumption by these inverter stages. When transistor 36 is turned on node 38 is pulled essentially to ground potential. Node 38 comprises the input to stage 80. When node 38 goes low transistor 48 is rendered nonconductive thereby permitting transistor 52 to pull node 50 to a high voltage state. In this condition stage 80 consumes essentially zero power since no current is transmitted through transistor 48.

The high voltage state at node 50 serves to turn on transistor 54 thereby pulling node 56 to ground. The high state on node 50 serves to turn on transistors 60 and 62 and the low state at node 56 serves to turn off transistors 72 and 74. Node 64, output signal A, is driven to a low voltage state and node 66, output signal $\overline{A}$, is driven to a high voltage state. Thus, the address buffer 10, in contrast to conventional address buffers, produces complementary output address signals in the power down mode.

In random access memories there is a possibility that an address line which is driven to a high level during the power down mode, can possibly destroy stored data. However, for read only memories (ROM) there is not such a problem since the data states are permanently fabricated into the memory cells. Therefore, the present invention is particularly applicable to ROM circuits.

Unless stated otherwise the transistors described herein are N-channel enhancement mode devices and it is recognized that an equivalent circuit can be produced with P-channel devices.

Although one embodiment of the invention has been illustrated in the accompanying Drawings and described in the foregoing Detailed Description, it will be understood that the invention is not limited to the embodiment disclosed but is capable of numerous rearrangements, modifications and substitutions without departing from the scope of the invention.

I claim:

1. A semiconductor memory address buffer having a power down mode, comprising:

a plurality of serially connected amplifier stages, the first of said amplifier stages connected to receive an input address signal, means connected to receive an enable signal, which has a power down state, for terminating power consumption for all but a first selected one of said amplifier stages when said enable signal is in said power down state, means connected to receive said enable signal for driving the input of said first selected amplifier stage to a state wherein said first selected amplifier stage has essentially zero power consumption when said enable signal is in said power down state and said first selected amplifier stage drives a second selected one of said amplifier stages to a predetermined state;

and an output stage means connected to said selected amplifier stages for generating complementary output address signals that are a function of said input address signal when said enable signal is in other than said power down state and said output stage generating predetermined complementary output address signals when said enable signal is in said power down state.

2. The address buffer recited in claim 1 wherein each of said amplifier stages is an inverter.

3. The address buffer recited in claim 1 wherein said output stage is a push-pull amplifier receiving complementary inputs from said first and second selected stages and generating said complementary output address signals as a function of said complementary inputs.

4. The address buffer recited in claim 1 wherein said means for terminating power consumption comprises a transistor for each of said amplifier stages, other than said first selected stage, wherein said transistors are each connected serially between the corresponding amplifier stage and a power terminal and serve to provide power to the corresponding amplifier stages, each transistor having the control terminal thereof connected to receive said enable signal.

5. A semiconductor address buffer having a power down mode, comprising:
- a first transistor having the gate terminal thereof connected to receive an address signal, the drain terminal thereof connected to a first node and the source terminal thereof connected to a common node;
- a second transistor having the gate terminal thereof connected to said first node, the drain terminal thereof connected to a second node and the source terminal thereof connected to said common node;
- a third transistor having the gate terminal thereof connected to said second node, the drain terminal thereof connected to a third node and the source terminal thereof connected to said common node;
- a fourth transistor having the gate terminal thereof connected to said third node, the drain terminal thereof connected to a fourth node and the source terminal thereof connected to a common node;
- a fifth transistor having the gate terminal thereof connected to said third node, the drain terminal thereof connected to a fifth node and the source terminal thereof connected to said common node;
- a sixth transistor having the gate terminal thereof connected to said fourth node, the drain terminal thereof connected to a sixth node, and the source terminal thereof connected to said common node;
- a seventh transistor having the gate terminal thereof connected to said fourth node, the drain terminal thereof connected to a power terminal and the source terminal thereof connected to said fifth node;
- an eighth transistor having the gate terminal thereof connected to said third node, the drain terminal thereof connected to said power terminal and the source terminal thereof connected to said sixth node;
- a ninth transistor having the gate and source terminals thereof connected to said second node and the drain terminal thereof connected to a seventh node;
- a tenth transistor having the gate and source terminals thereof connected to said third node and the drain terminal thereof connected to an eighth node;
- an eleventh transistor having the gate and source terminals thereof connected to said fourth node and the drain terminal thereof connected to a ninth node;
- a twelth transistor having the gate terminal thereof connected to a tenth node which receives an enable signal, the drain terminal thereof connected to said power terminal and the source terminal thereof connected to said first node;
- a thirteenth transistor having the gate terminal thereof connected to said tenth node, the drain terminal thereof connected to said power terminal and the source terminal thereof connected to said seventh node;
- a fourteenth transistor having the gate terminal thereof connected to said tenth node, the drain terminal thereof connected to said power terminal and the source terminal thereof connected to said ninth node; and
- a fifteenth transistor having the source terminal thereof connected to an eleventh node which receives the complement of said enable signal, the drain terminal thereof connected to said second node and the source terminal thereof connected to said common node.

6. The address buffer recited in claim 5 wherein said ninth, tenth and eleventh transistors are depletion devices.

7. The address buffer recited in claim 5 wherein said twelth, thirteenth and fourteenth transistors are lightly depleted devices.

* * * * *